(12) United States Patent
Liaw

(10) Patent No.: US 9,773,792 B1
(45) Date of Patent: Sep. 26, 2017

(54) ONE-TIME PROGRAMMING CELL

(71) Applicant: TAIWAN SEMICONDUCTOR MANUFACTURING CO., LTD., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/261,252

(22) Filed: Sep. 9, 2016

Related U.S. Application Data

(60) Provisional application No. 62/313,681, filed on Mar. 25, 2016.

(51) Int. Cl.
| | | |
|---|---|---|
| *G11C 17/16* | (2006.01) | |
| *H01L 27/112* | (2006.01) | |
| *G11C 17/18* | (2006.01) | |
| *H01L 23/525* | (2006.01) | |
| *G11C 17/12* | (2006.01) | |

(52) U.S. Cl.
CPC ........ *H01L 27/11206* (2013.01); *G11C 17/16* (2013.01); *G11C 17/18* (2013.01); *H01L 23/5252* (2013.01); *G11C 17/12* (2013.01); *G11C 17/123* (2013.01)

(58) Field of Classification Search
CPC ......... G11C 17/06; G11C 17/08; G11C 17/12; G11C 17/123; G11C 17/18

USPC .......................... 365/95, 63, 72, 94, 103, 104
See application file for complete search history.

(56) References Cited

U.S. PATENT DOCUMENTS

| | | | |
|---|---|---|---|
| 6,580,145 B2 | 6/2003 | Wu et al. | |
| 8,487,378 B2 | 7/2013 | Goto et al. | |
| 8,576,603 B2* | 11/2013 | Verhaar ................. | H01L 27/112 365/103 |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,443,860 B1* | 9/2016 | Sung ................. | H01L 27/11206 |
| 2009/0250726 A1* | 10/2009 | Kurjanowicz ...... | H01L 23/5252 257/209 |
| 2016/0104711 A1* | 4/2016 | Hsu ........................ | G11C 16/14 257/300 |

* cited by examiner

*Primary Examiner* — Tan T. Nguyen
(74) *Attorney, Agent, or Firm* — McDermott Will & Emery LLP

(57) ABSTRACT

A one-time programming cell includes a first metal oxide semiconductor (MOS) structure and a second transistor having a common gate electrode electrically connected to a word line. The first MOS structure has a first gate dielectric layer and the second MOS structure has a second gate dielectric layer. The second gate dielectric layer is thicker than the first gate dielectric layer. Source nodes of the first MOS structure and the second MOS structure are electrically connected, and a drain node of the second MOS structure is electrically connected to a bit line.

20 Claims, 16 Drawing Sheets

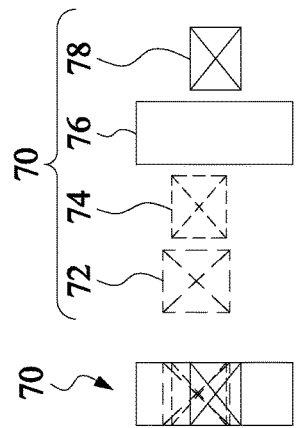
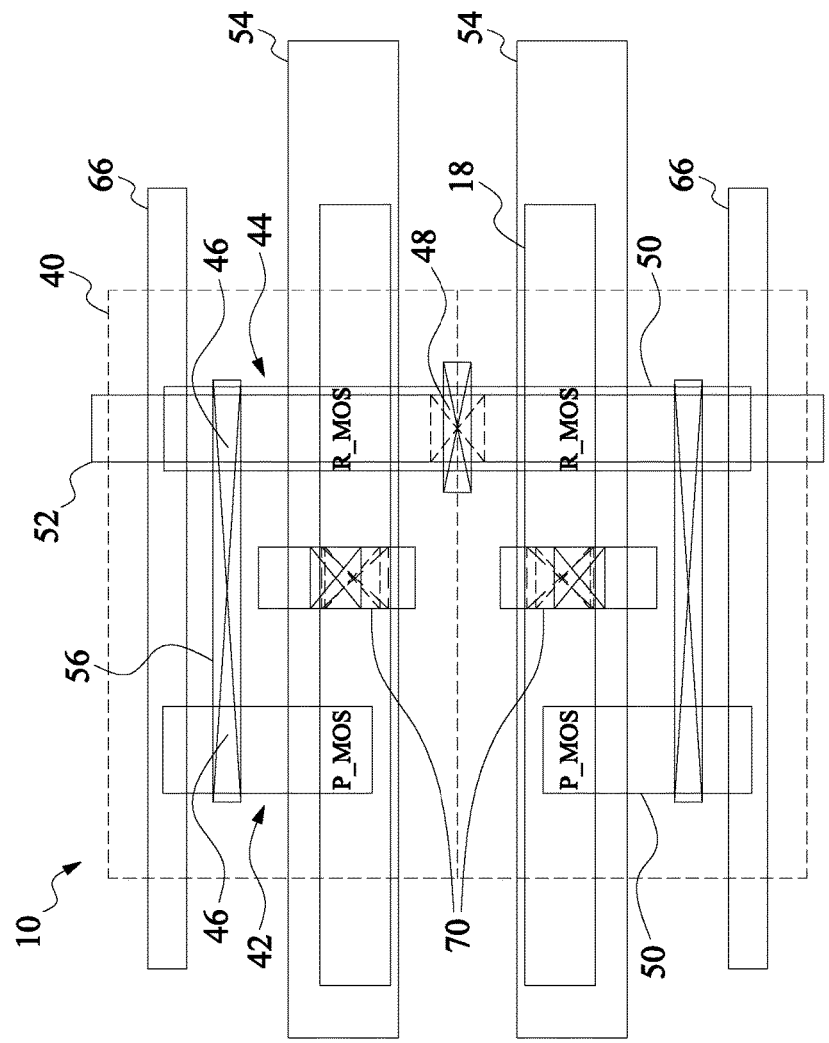
Fig. 4C
Fig. 4B

|  | R/P WL (selected) | R/P WL (non-selected) | R/P BL (selected) | R/P BL (non-selected) |
|---|---|---|---|---|
| Program cycle | 3~5V | 0V | 0V | 1.5~2.5V |
| Read cycle | 0.8~1.8V | 0V | Pre-state: 0V and electrically connected to SA | 0V, or floating or predetermined voltage |

Fig. 5

ONE-TIME PROGRAMMING CELL

CROSS REFERENCE TO PROVISIONAL APPLICATIONS

This application claims priority from U.S. provisional patent application Ser. No. 62/313,681; filed Mar. 25, 2016, the entire disclosure of which is incorporated herein by reference.

TECHNICAL FIELD

The disclosure relates to semiconductor integrated circuits, more particularly to a one-time programing cell comprising a first metal oxide semiconductor structure and a second metal oxide semiconductor structure having a common gate electrode electrically connected to a word line, antifuse circuits including the one-time programming cell, and a method of programming a one-time programming chip comprising a plurality of one-time programming cells.

BACKGROUND

An antifuse is designed to create a permanent electrically conductive path in a microelectronic device. The programming of the antifuse generally occurs when the voltage across the antifuse exceeds a certain level. Antifuses are used to permanently program integrated circuits. Antifuse programmable logic devices (PLDs) are one time programmable in contrast to other PLDs which may be reprogrammed. Antifuses may be used in programmable read-only memory (PROM). It is desirable in the microelectronic field to provide one-time programming cells for antifuse devices that have higher reliability and are simpler to operate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A-4C illustrate another embodiment of a semiconductor device having a one-time programming cell according to the present disclosure.

FIG. 5 illustrates programming parameters of a one-time programming cell according to an embodiment of the present disclosure.

DETAILED DISCUSSION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1B:
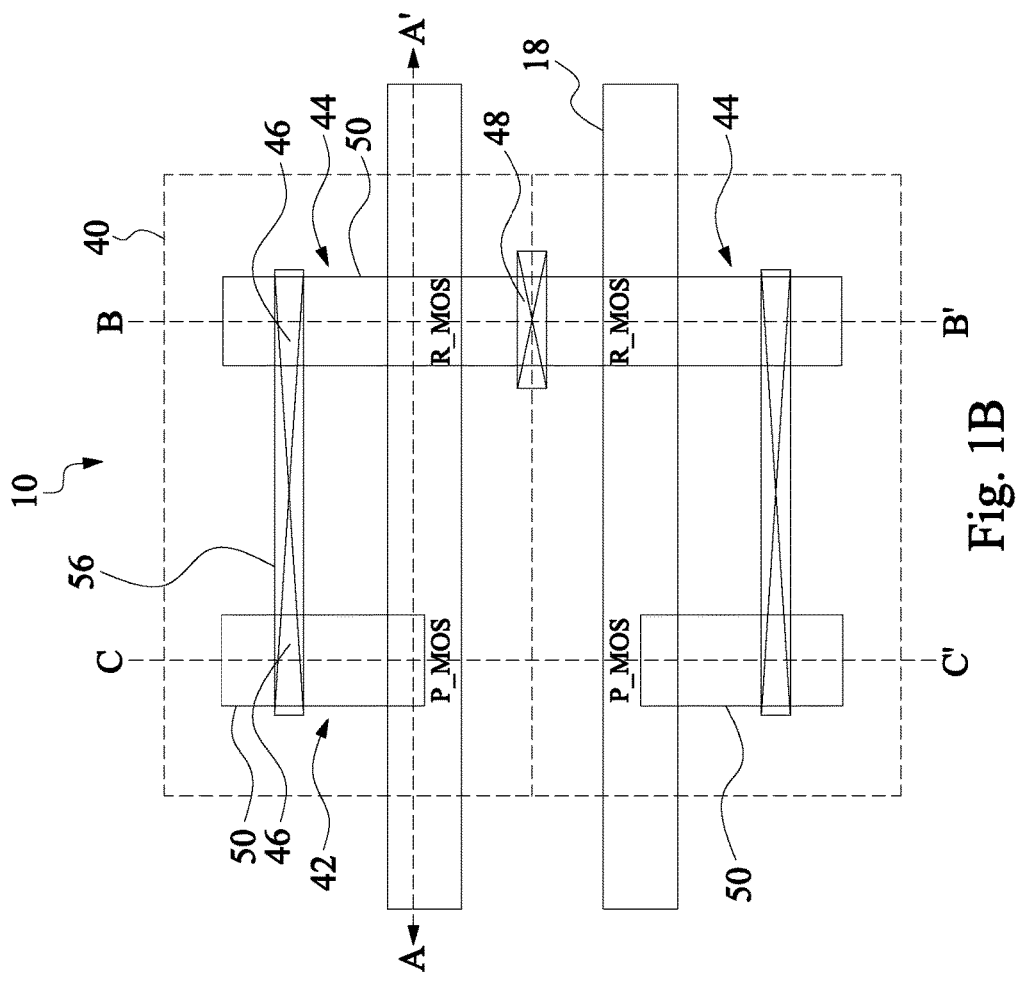
FIGS. 1A-1E illustrate an embodiment of a semiconductor device having a one-time programming cell according to the present disclosure.
Figure 1A:
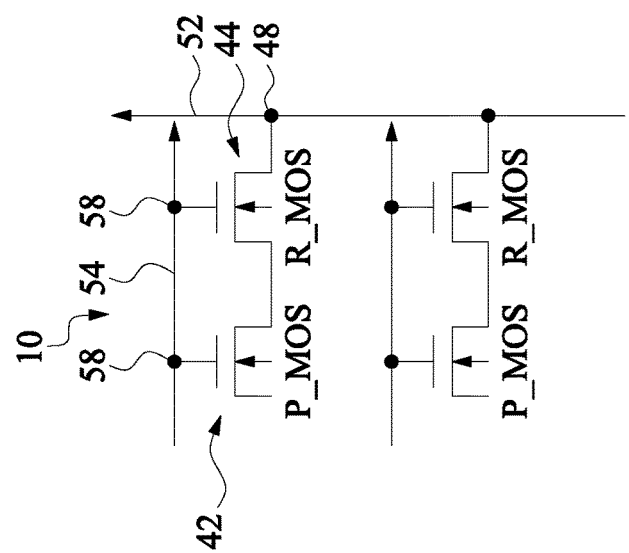
Figure 1C:
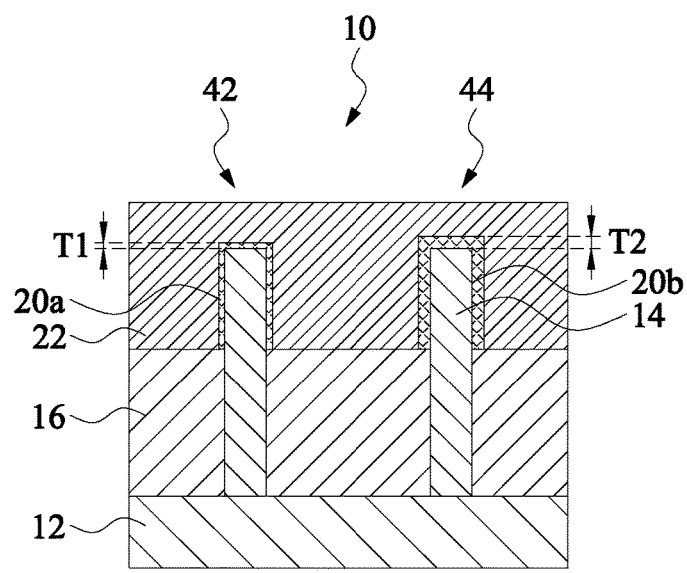
Figure 1D:
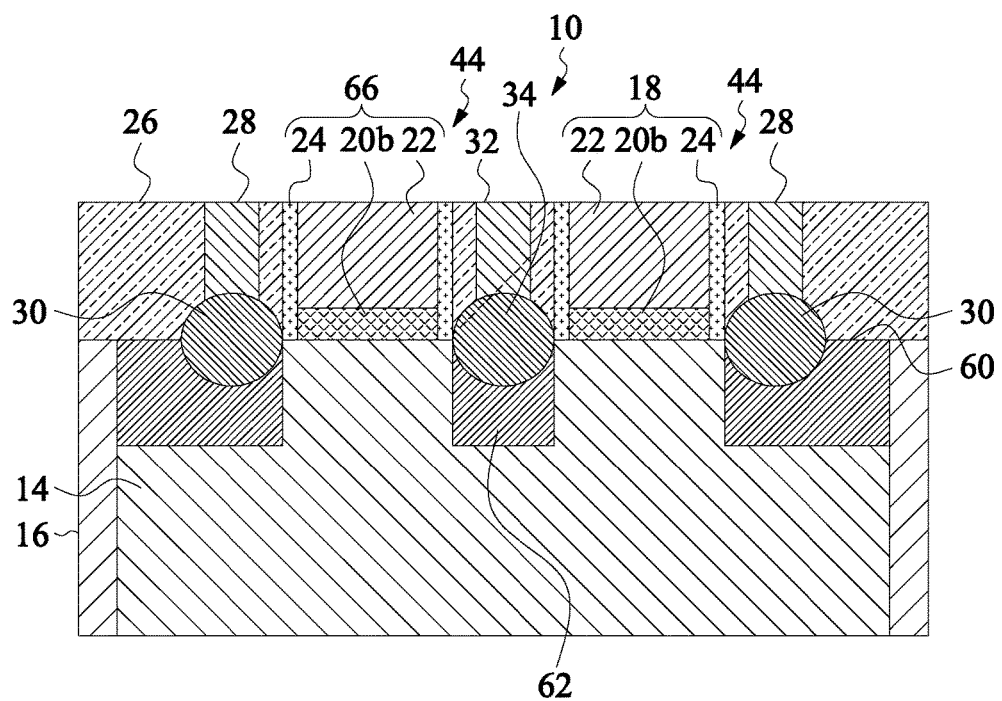
Figure 1E:
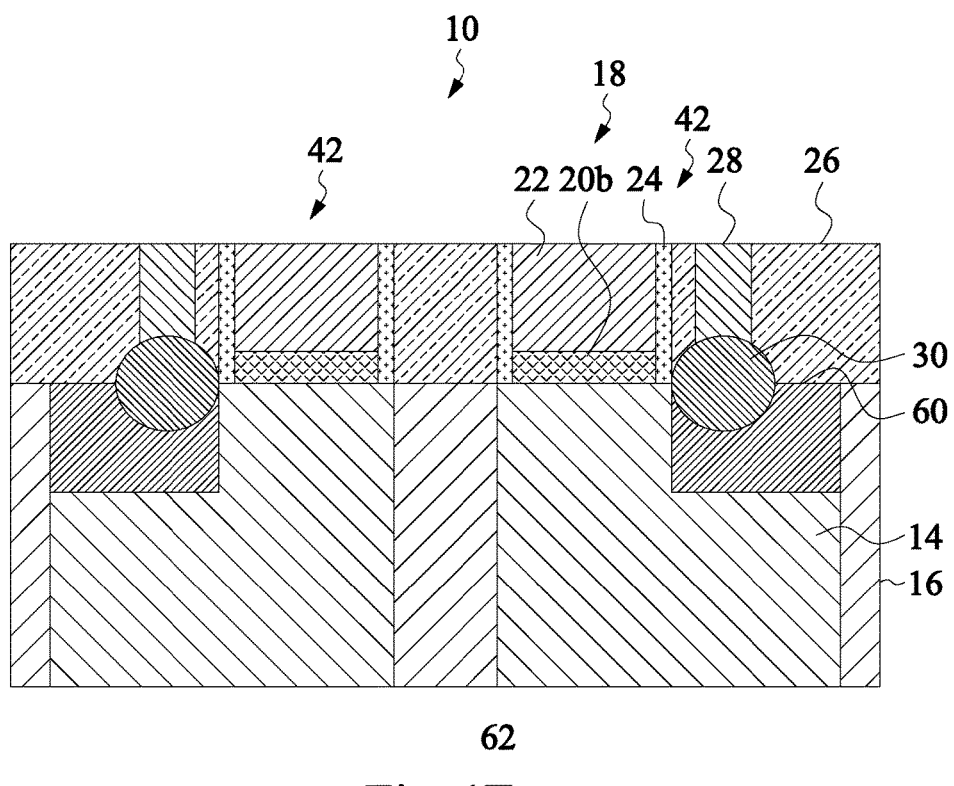

FIGS. 1A-1E illustrate an embodiment of a one-time programming cell according to the present disclosure. FIG. 1A is a circuit diagram of the one-time programming cell according an embodiment of the present disclosure. FIG. 1B is a layout (plan view) of the one-time programming cell according to an embodiment of the disclosure. FIGS. 1C, 1D, and 1E are cross-sectional views of the one-time programming cell corresponding to lines A-A', B-B', and C-C' in FIG. 1B, respectively.

As shown in FIG. 1A, an embodiment of the one-time programming cell 10 includes a first metal oxide semiconductor (MOS) structure 42 and a second MOS structure 44 electrically connected to a word line 54 at gate nodes 58. A drain node 48 of the second transistor 44 is electrically connected to a bit line 52. The MOS structures 42, 44 include field effect transistors (FETs) in some embodiments, and partial FETs in other embodiments. The first MOS structure 42 is a programming device. In this embodiment, the first MOS structure 42 is a partial programming metal oxide semiconductor field effect transistor (partial P_MOSFET or partial P_MOS transistor). The second MOS structure 44 is a reading device. In this embodiment, the second transistor 44 is a reading metal oxide semiconductor field effect transistor (R_MOSFET or R_MOS transistor). The term MOS structure is not limited to only those structures containing a metal oxide gate dielectric layer, but rather, includes other types of gate dielectric layers, such as metal nitride gate dielectric layers.

As shown in the plan view, FIG. 1B, a pair of partial P_MOS transistors 42 and a pair of R_MOS transistors 44 are formed including active regions 50. In some embodiments, the transistors are fin field effect transistors (FinFET) and the active regions correspond to the fins. As shown in FIG. 1B, source nodes 46 of adjacent partial P_MOS transistor 42 and R_MOS transistor 44 are electrically connected via an electrically conductive source connector 56. The adjacent P_MOS transistor 42 and R_MOS transistor share a common gate electrode in some embodiments. As shown in FIG. 1B, common gate electrode structures 18 overlie the active regions 50 of the P_MOS transistor 42 and the R_MOS transistor 44. The active regions 50 of the partial P_MOS transistors 42 extend from outside the source conductor 56 and stop under the gate electrode 18 to form partial FETs.

The gate electrode structures 18 include a gate dielectric layer 20a, 20b disposed on the fin 14 and a gate electrode 22 overlying the gate dielectric layer 20, 20b, as shown in FIGS. 1C and 1D. Gate sidewalls 24 are disposed on the side walls of the gate electrode 22, as shown in FIGS. 1D-1E. The gate dielectric layer 20a of the partial P_MOS transistor 42 has a thickness T1, and the gate dielectric layer 20b of the R_MOS transistor 44 has a thickness T2. The thickness T2 of the gate dielectric layer 20b of the R_MOS transistor 44 is greater than the thickness T1 of the gate dielectric layer 20a of the partial P_MOS transistor 42. In some embodiments, the thickness T2 is at least 30% thicker than the thickness T1. In other embodiments, the thickness T2 is at least 50% thicker than the thickness T1.

A pair of unit cells are illustrated in FIGS. 1A and 1B. It is understood that a semiconductor device can include a plurality of unit cells arranged in series and parallel to form a one-time programming chip having an array of unit cells. The unit cells are defined by the unit cell boundaries 40 as shown in FIG. 1B.

As shown in FIG. 1C, the fins 14 are formed on a substrate 12, such as a semiconductor substrate. An insulating layer 16 is formed in the region between the fins 14. The portion of the fins 14 protruding from the insulating layer 16 is the active region of the fins 14 where source/drain regions and channel regions are formed in some embodiments. As shown in FIG. 1D, source and drain electrodes 28, 32 are connected to source and drain regions 60, 62 of the fin 14 via source and drain contacts 30, 34, respectively. The source and drain electrodes 28, 30 are formed in an interlayer dielectric 26, which surrounds the gate electrode structures 18.

FIG. 1D is a cross section corresponding to line B-B' of FIG. 1B illustrating the two R_MOS transistors 44 with the thicker gate dielectric layers 20b. FIG. 1E is a cross section corresponding to line C-C' illustrating the two partial P_MOS transistors 42 with the thinner gate dielectric layers 20a. The insulating layer 16 separates the active regions 50 of the two partial P_MOS transistors 42.

In one embodiment, the substrate 12 includes a single crystalline semiconductor layer on at least its surface portion. The substrate 12 may comprise a single crystalline semiconductor material such as, but not limited to Si, Ge, SiGe, GaAs, InSb, GaP, GaSb, InAlAs, InGaAs, GaSbP, GaAsSb, and InP. In a certain embodiment, the substrate 12 is made of Si.

The substrate 12 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the silicon germanium (SiGe) buffer layer is epitaxially grown on the silicon substrate 12. The germanium concentration of the SiGe buffer layers may increase from 30 atomic % for the bottom-most buffer layer to 70 atomic % for the top-most buffer layer.

The fins 14 may be formed of the same material as the substrate 12 and may formed by etching trenches into the substrate 12 to form the fins 14. Alternatively, the fins 14 may be formed by epitaxial deposition on the substrate 12.

The material for the source/drain regions 60, 62 includes one or more layers of Ge or SiGe, for P-type FETs, and one or more layers of Si, SiP, or SiC for N-type FETs. The source/drain regions 60, 62 are formed by an epitaxial growth method using CVD, ALD, or molecular beam epitaxy (MBE) in some embodiments.

The insulating material for the insulating layer 16 may include silicon oxide, silicon nitride, silicon oxynitride (SiON), SiOCN, fluorine-doped silicate glass (FSG), or a low-k dielectric material, formed by LPCVD (low pressure chemical vapor deposition), plasma-CVD or flowable CVD. In the flowable CVD (FCVD), flowable dielectric materials instead of silicon oxide are deposited over a substrate. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These precursors may be combined with gases such as $O_2$, $O_3$, $N_2$, Ar, $H_2$, He, and/or $NH_3$. Plasma-CVD may also be used in the FCVD. An anneal operation may be performed after the formation of the insulating layer 16.

In some embodiments, the gate electrode structure 18 is formed by a gate first method with the gate dielectric layer 20a, 20b formed of silicon dioxide in some embodiments. In other embodiments, the gate electrode 22 is formed by a gate last method using a high-k dielectric and a metal gate (HK/MG). In the gate last method, a dummy gate is formed, the dummy gate is subsequently removed at a later operation after a high temperature annealing operation, and the high-k dielectric and a metal gate (HK/MG) is formed.

According to embodiments of the disclosure, the high-k gate dielectric may comprise one or more layers of $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The metal gate material may comprise one or more layers of Ti, TiN, titanium-aluminum alloy, Al, AlN, Ta, TaN, TaC, TaCN, TaSi, W, Ni, Cu, WSi, and the like.

The different thicknesses T1, T2 of the gate dielectric layers 20a, 20b of the different types of MOS structures 42, 44 can be formed by suitable deposition and etching operations. For example, in embodiments of the present disclosure including MOS structures formed by a gate first method, the gate dielectric layer 20a, 20b can be formed in both the first MOS structure 42 and the second MOS structure 44 by a gate dielectric thermal growth operation at a temperature of about 500° C. to about 1200° C. to a desired thickness in certain embodiments. The gate dielectric layer of the second MOS structure 44 is subsequently protected by a mask, such as a nitride material, and the gate dielectric layer in the first MOS structure 42 is removed by a suitable etchant. After removing the gate dielectric layer in the first MOS structure, the mask is removed from over the second MOS structure 44, and an additional gate dielectric layer is thermally grown in the first MOS structure 42 and the second MOS structure 44 until a final desired thickness is obtained. Thus, the thickness T2 of the gate dielectric layer 20b of the second MOS structure 44 is thicker than the thickness T1 of the gate dielectric layer 20a of the first MOS structure 42.

In embodiments of the present disclosure including transistors formed by a gate last method, the gate dielectric layer 20a, 20b can be formed by initially masking the first MOS structure 42 and depositing the gate dielectric material in the second MOS structure 44 until a desired thickness of the gate dielectric material is obtained. The mask is subsequently removed from the first MOS structure 42 and then deposition of the gate dielectric material is continued in both the first MOS structure 42 and the second MOS structure 44 until the desired final thicknesses T1, T2 of the gate dielectric layers 20a, 20b of the first MOS structure 42 and the second MOS structure 44 are obtained.

The sidewall spacers 24 may be formed by suitable deposition and etch techniques, and may comprise one or more layers of silicon nitride, silicon oxide, silicon carbide, silicon oxynitride, silicon carbon oxynitride, other suitable materials, or combinations thereof. The thickness of the sidewall insulating layers 24 is in a range of about 5 nm to about 30 nm in some embodiments, and in a range of about 10 nm to about 20 nm in other embodiments.

In some embodiments of the disclosure, source/drain electrodes 28, 32 are formed contacting the respective source/drain regions. The electrodes may be formed of a suitable conductive material, such as copper, tungsten, nickel, titanium, or the like. In some embodiments, metal silicide source/drain contacts 30, 34 are formed at the source/drain electrodes 28, 32 and source/drain regions 60, 62 interface to improve conductivity at the interface. In some embodiments, the source/drain electrodes 28, 32 are metal plugs. In certain embodiments, tungsten is used to form tungsten plugs. The metal silicide source/drain contacts 30, 34 are formed by depositing a film of a suitable metal, such as cobalt, nickel, or titanium, on the source/drain regions 60, 62 and applying heat to cause a silicidation reaction between the deposited metal and the underlying source/drain region 60, 62. During the silicidation, a portion of the source/drain region 60, 62 is consumed.

The interlayer dielectric film 26 (ILD) is formed over the FinFET device 10 to separate the FinFET device 10 from upper wiring layers. The ILD 26 can be formed by LPCVD, plasma-CVD or flowable CVD. In the flowable CVD (FCVD), flowable dielectric materials instead of silicon oxide are deposited over a substrate. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These precursors may be combined with gases such as $O_2$, $O_3$, $N_2$, Ar, $H_2$, He, and/or $NH_3$. Plasma-CVD may also be used in the FCVD.

In certain embodiments of the disclosure, the first MOS structure 42 and the second MOS structure 44 are N-type metal oxide semiconductor field effect transistors (MOSFETs).

In some embodiments of the disclosure, the programming devices are selected from core devices and the reading devices are selected from input/output devices. Core devices generally operate at lower voltage and higher speed than the input/output devices which operate at higher voltage and lower speed. In certain embodiments, the gate dielectric layer of the programming devices is substantially the same as the gate dielectric layers in the core devices and the gate dielectric layer of the reading devices is substantially the same as the gate dielectric layers in the input/output devices.

Figure 2B:
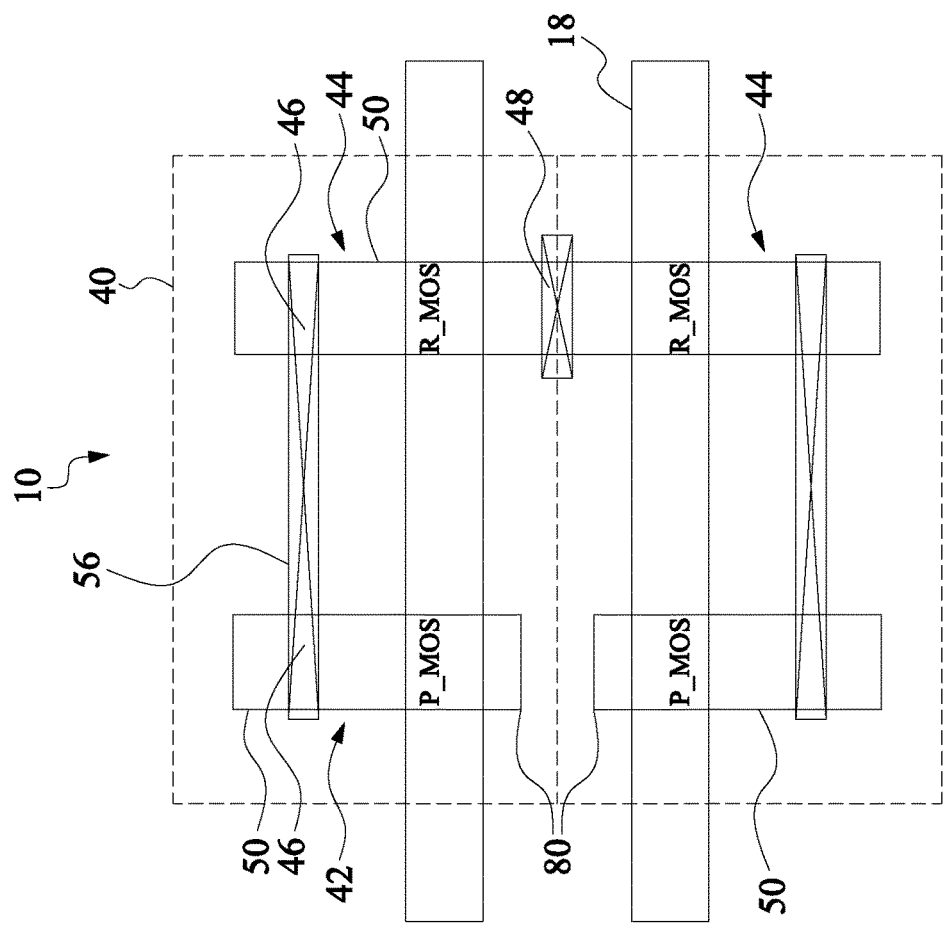
FIGS. 2A-2B illustrate another embodiment of a semiconductor device having a one-time programming cell according to the present disclosure.
Figure 2A:
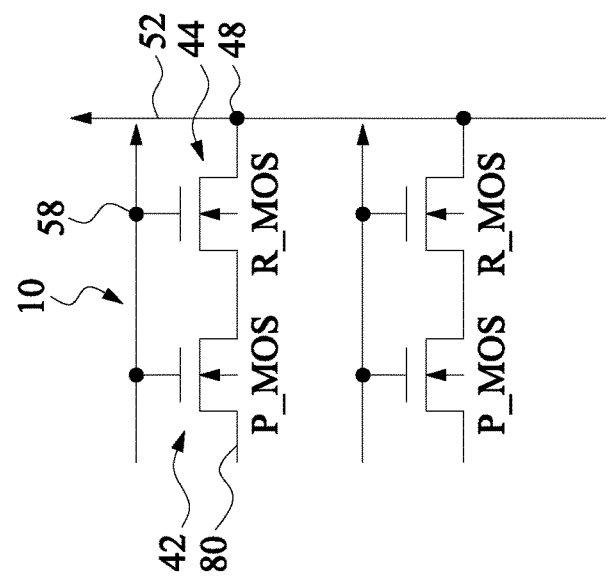

FIGS. 2A and 2B illustrate an embodiment of a one-time programming cell 10 according to the present disclosure. FIG. 2A is a circuit diagram of the one-time programming cell 10 according an embodiment of the present disclosure having a first MOS structure 42 with a floating drain node 80. FIG. 2B is a layout (plan view) of the one-time programming cell 10. This embodiment is similar to the embodiment disclosed in FIGS. 1A-1E with the difference being that the first MOS structure 42 is a P_MOS transistor with a floating drain node 80.

Figure 3:
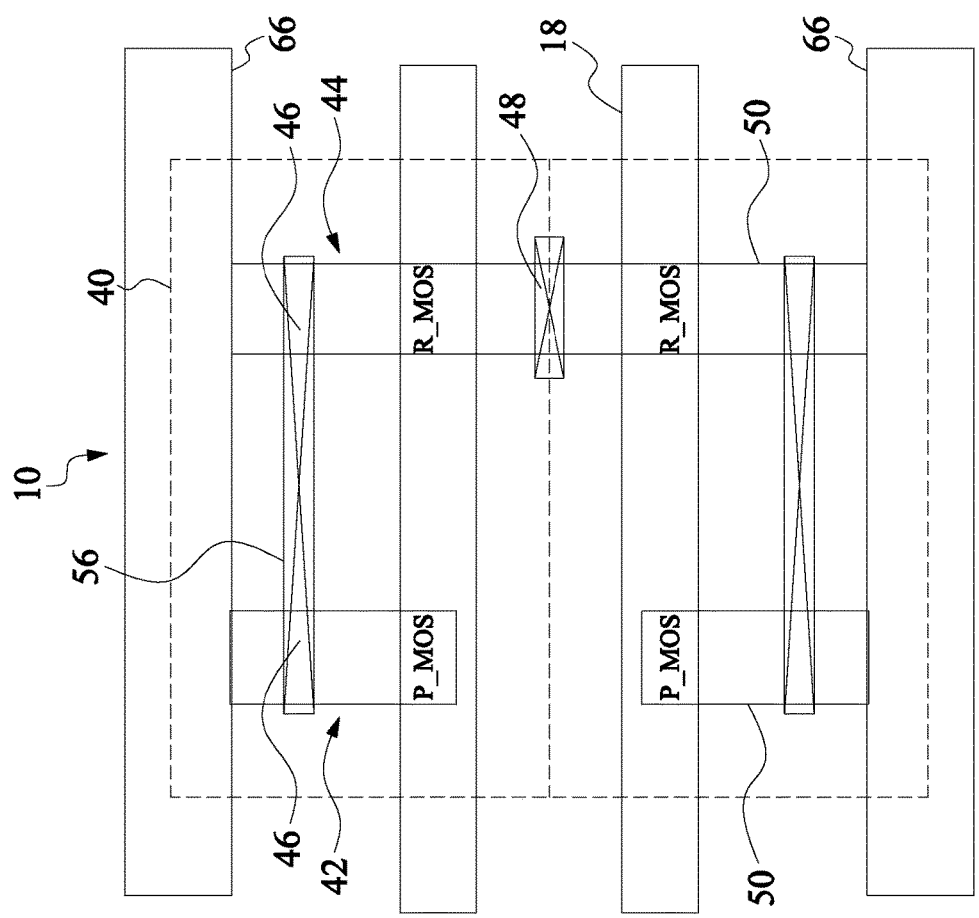
FIG. 3 illustrates another embodiment of a semiconductor device having a one-time programming cell according to the present disclosure.

FIG. 3 illustrates an embodiment of a one-time programming cell 10 according to the present disclosure having shared dummy gates 66. FIG. 3 is a plan view of the one-time programming cell 10 showing the dummy gates 66 formed outside the source nodes 46 of the first MOS structure 42 and the second MOS structure 44. Similar to the embodiment of FIGS. 1A-1E, in this embodiment the first MOS structure 42 is a partial P_MOS transistor and the second MOS structure 44 is a R_MOS transistor. In this embodiment, the dummy gates 66 are formed at unit cell boundaries 40. Thus, the dummy gates 66 are shared by adjacent unit cells. The dummy gates 66 are formed outside the source nodes 46. The dummy gates 66 are used to improve the uniformity of the gate critical dimensions. In some embodiments the dummy gates 66 are arranged in the same pitch (spacing) as the gate electrode structures 18. In other embodiments, the dummy gates 66 are arranged with a different pitch than the gate electrode structures 18.

Figure 4A:
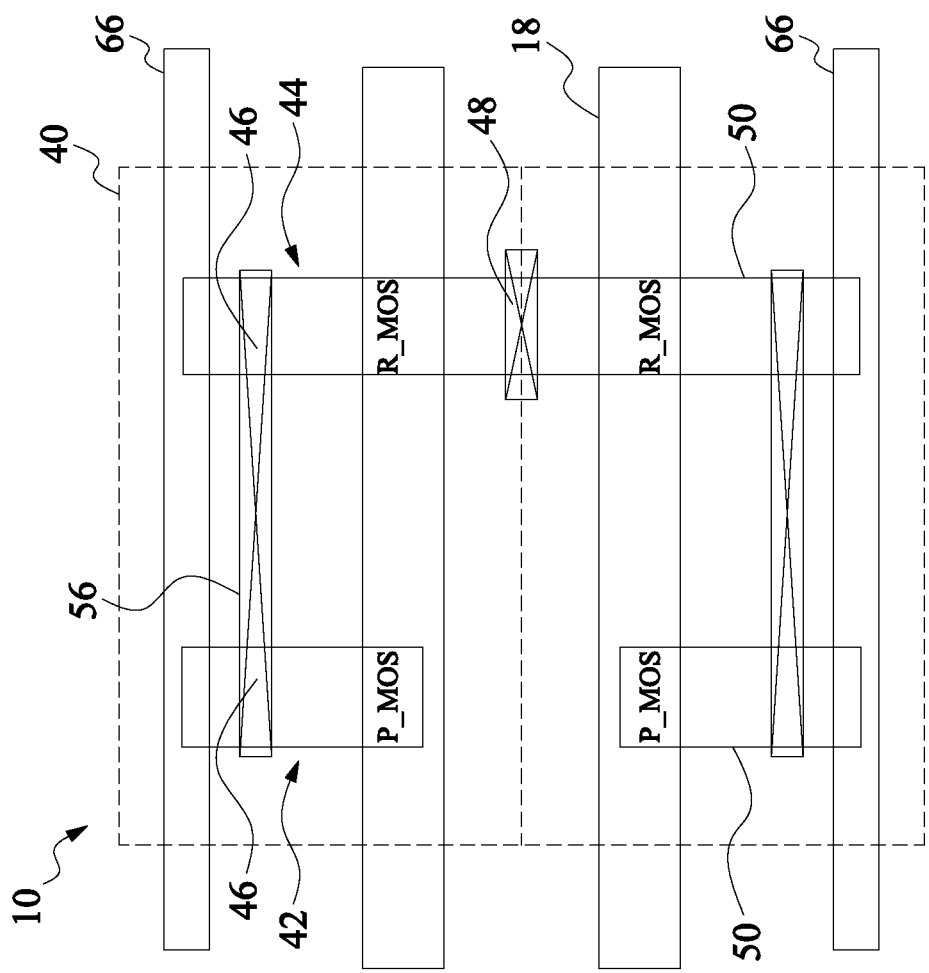

FIGS. 4A-4C illustrate an embodiment of a one-time programming cell 10 according to the present disclosure having dummy gates 66. This embodiment is similar to the embodiment of FIG. 3 with the difference that the dummy gates 66 are disposed over the active regions 50 rather than the unit cell boundaries 40. FIG. 4A is a plan view of the one-time programming cell 10 showing the dummy gates 66. FIG. 4B is a plan view of the one-time programming cell 10 including the metal routing of the bit line 52, word lines 54, and contacts.

A legend of the gate electrode to word line connection 70 in some embodiments is shown in FIG. 4C. A gate contact 72 is connected to the gate electrode 18 and an overlying first conductive via layer 74. The first conductive via layer 74 connects the gate contact 72 to a first metal layer 76. The first metal layer 76 is connected to the word lines 54 by the second conductive via layer 78. The drain of the R_MOS transistors 44 are connected to the bit line 52 at the drain node 48 via the second conductive via layer 78. In certain embodiments, the bit line 52 is arranged substantially perpendicular to the word lines 54, as shown in plan view. The routing of the bit line 52 and the word line 54 is also applicable to FIGS. 1A-3.

Methods of programming one-time programming chips according to embodiments of the present disclosure are described in FIGS. 5 to 9. The programming parameters of one embodiment are illustrated in FIG. 5.

During the program cycle of some embodiments, a voltage of about 3 to about 5 V is applied to a reading/ programming selected word line (R/P WL) and non-selected R/P WLs are held at 0 V. During the program cycle of some embodiments, a selected reading/programming bit line (R/P BL) is held at 0 V and a voltage of about 1.5 to about 2.5 V is applied to non-selected R/P BLs. During the read cycle of some embodiments, a voltage of about 0.8 to about 1.8 V is applied to the selected R/P WL, while the non-selected R/P WL are maintained at 0 V. In some embodiments during the read cycle, the selected R/P BL is maintained at 0V and the non-selected R/P BLs are maintained at 0 V or at a predetermined voltage.

Figure 6:
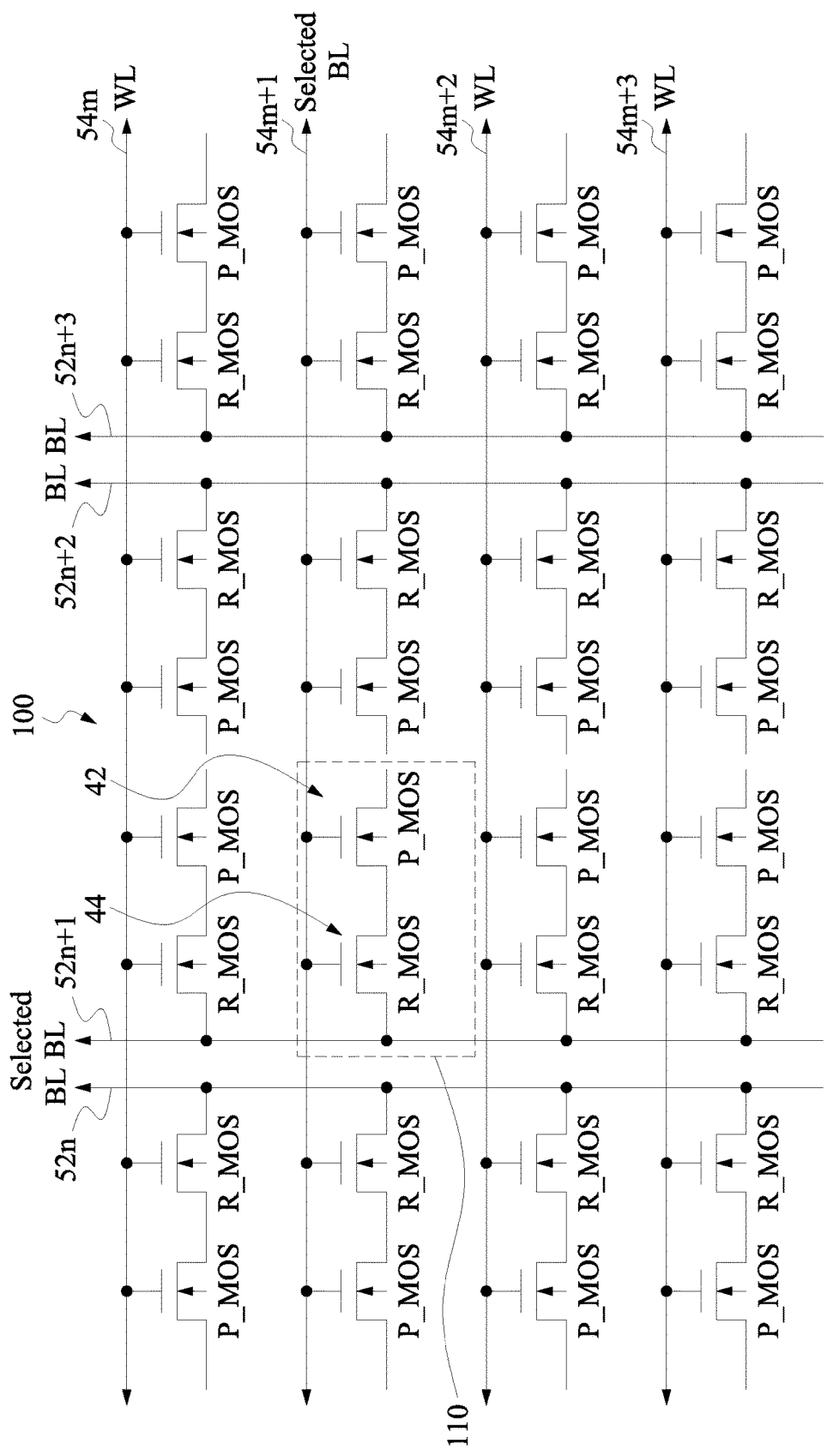
FIG. 6 illustrates a one-time programming chip circuit diagram according to an embodiment of the present disclosure.

A one-time programming chip 100 circuit diagram according to some embodiments of the present disclosure is illustrated in FIG. 6. The one-time programming chip 100 includes an array of one-time programming cells 110 each including a first programming MOS structure 42 and a second reading MOS structure 44. The MOS structures are arranged in an array of word lines WL (54$m$, 54$m$+1, 54$m$+2, 54$m$+3 . . . ) and bit lines BL (52$n$, 52$n$+1, 52$n$+2, 52$n$+3 . . . ). In some embodiments, the bit lines BL 52$n$, 52$n$+1, 52$n$+2, 52$n$+3 extend in the direction of the arrows to a sense amplifier (not shown).

Figure 7:
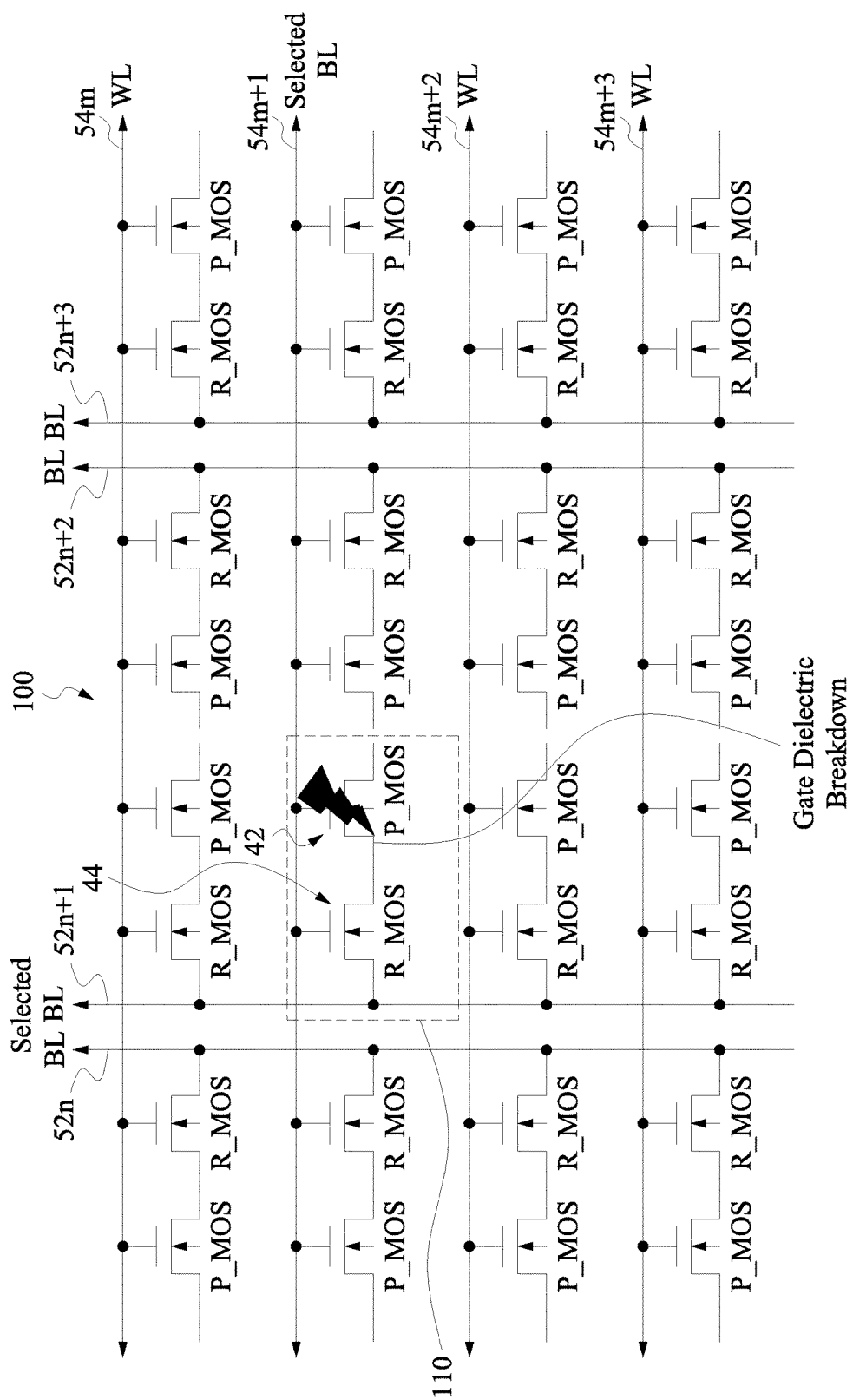
FIG. 7 illustrates a program cycle of a one-time programming chip circuit diagram according to an embodiment of the present disclosure.

In an example of a program cycle of a one-time programming chip, a selected bit line BL 52$n$+1 is set to 0 V and the non-selected bit lines BL 52$n$, 52$n$+2, 52$n$+3 are maintained at about 1.5 to about 2.5 V, as shown in FIG. 7. The selected word line WL 54$m$+1 is set to about 3.0 to about 5.0 V and the non-selected word lines WL 54$m$, 54$m$+2, 54$m$+3 are maintained at 0 V. The voltage of the word line WL 54$m$+1 is sufficient to cause gate dielectric breakdown of the gate dielectric layer of the thinner gate dielectric of the first MOS structure 42 of the selected one-time programming cell 110, while the thicker gate dielectric layer of the second MOS structure 44 is not broken down at this voltage level. In some embodiments, the thicker gate dielectric layer of the second MOS structure 44 withstands a voltage of about 7 V to 9 V before undergoing gate dielectric breakdown, while the thinner gate dielectric layer of first MOS structure undergoes gate dielectric breakdown at less than about 5 V.

Figure 8:
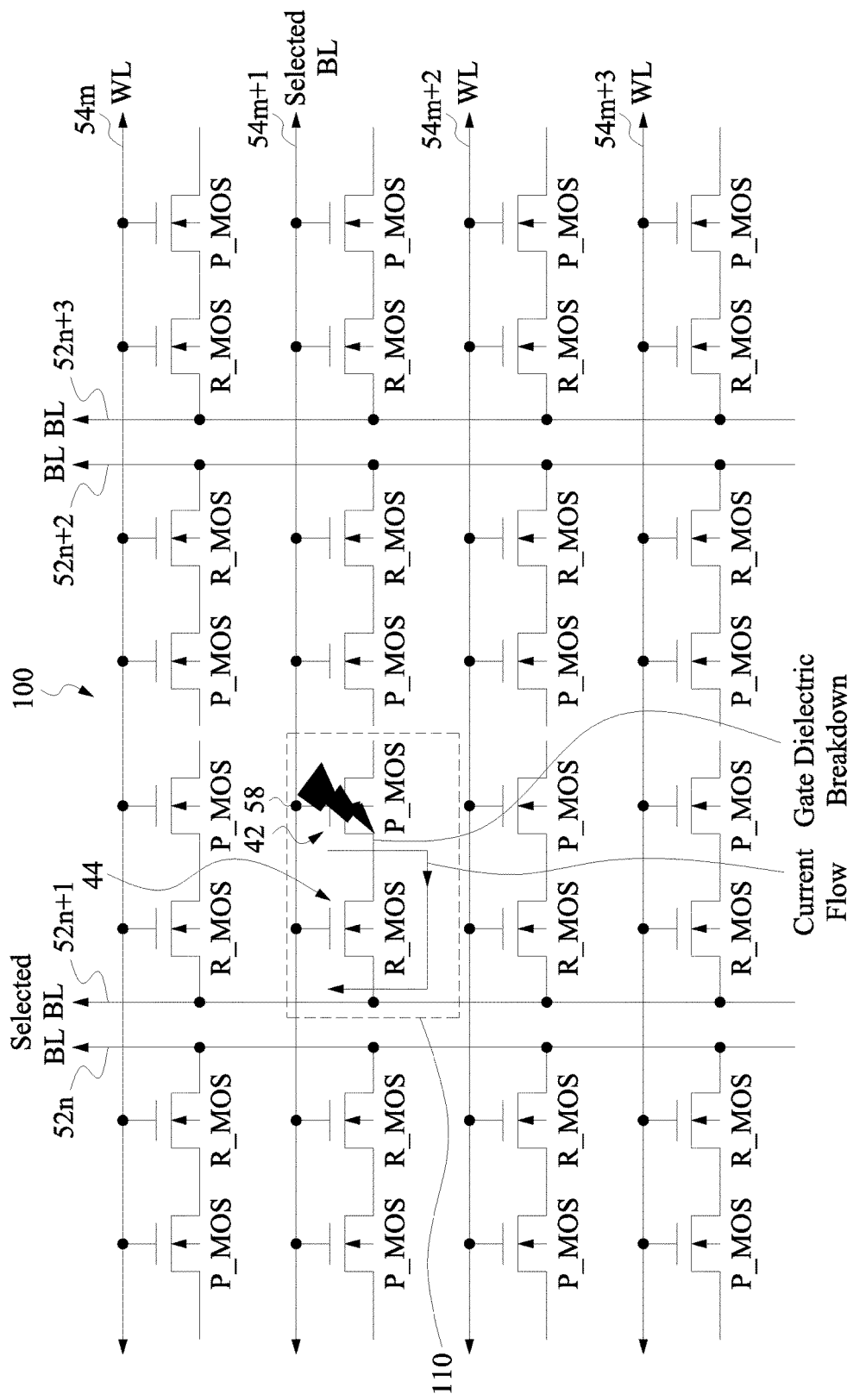
FIG. 8 illustrates a read cycle of a one-time programming chip circuit diagram according to an embodiment of the present disclosure.

In an example of a read cycle of a one-time programming chip, the selected bit line BL 52$n$+1 is increased to a voltage of about 0.6 V to about 1.6V during the read cycle, and the non-selected bit lines BL 52$n$, 52$n$+2, 52$n$+3 are maintained at either about 0 V, a floating voltage, or a predetermined voltage, resulting in current flow I from the gate node 58 of the first MOS structure 42 across the low resistance path of the gate dielectric layer through the second MOS structure 44, as shown in FIG. 8. The selected word line WL 54$m$+1 is set to about 0.8 to about 1.8 V and the non-selected word lines WL 54$m$, 54+2, 54$m$+3 are maintained at 0 V during the read cycle.

Figure 9:
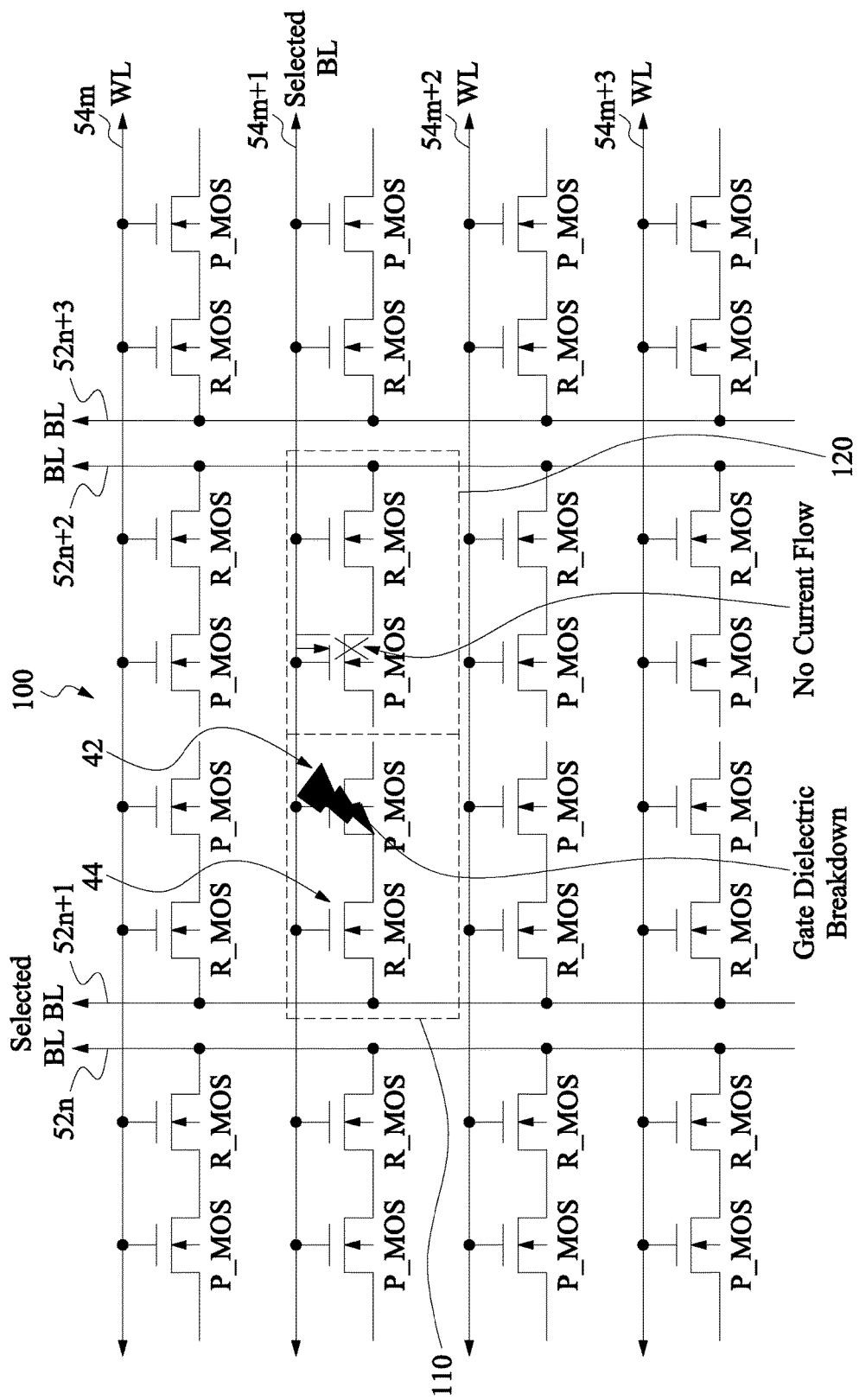
FIG. 9 illustrates a one-time programming chip circuit diagram according to an embodiment of the present disclosure.

During the read cycle, the voltage applied to word line WL 54$m$+1 and the voltage applied to bit line BL 52$n$+2 does not cause gate dielectric breakdown of the non-programming cell 120, which is adjacent the programming cell 110, which experienced gate dielectric breakdown, as shown in FIG. 9. Thus, current I does not flow through non-programming cell 120, which was not selected during the programming cycle.

Figure 10A:
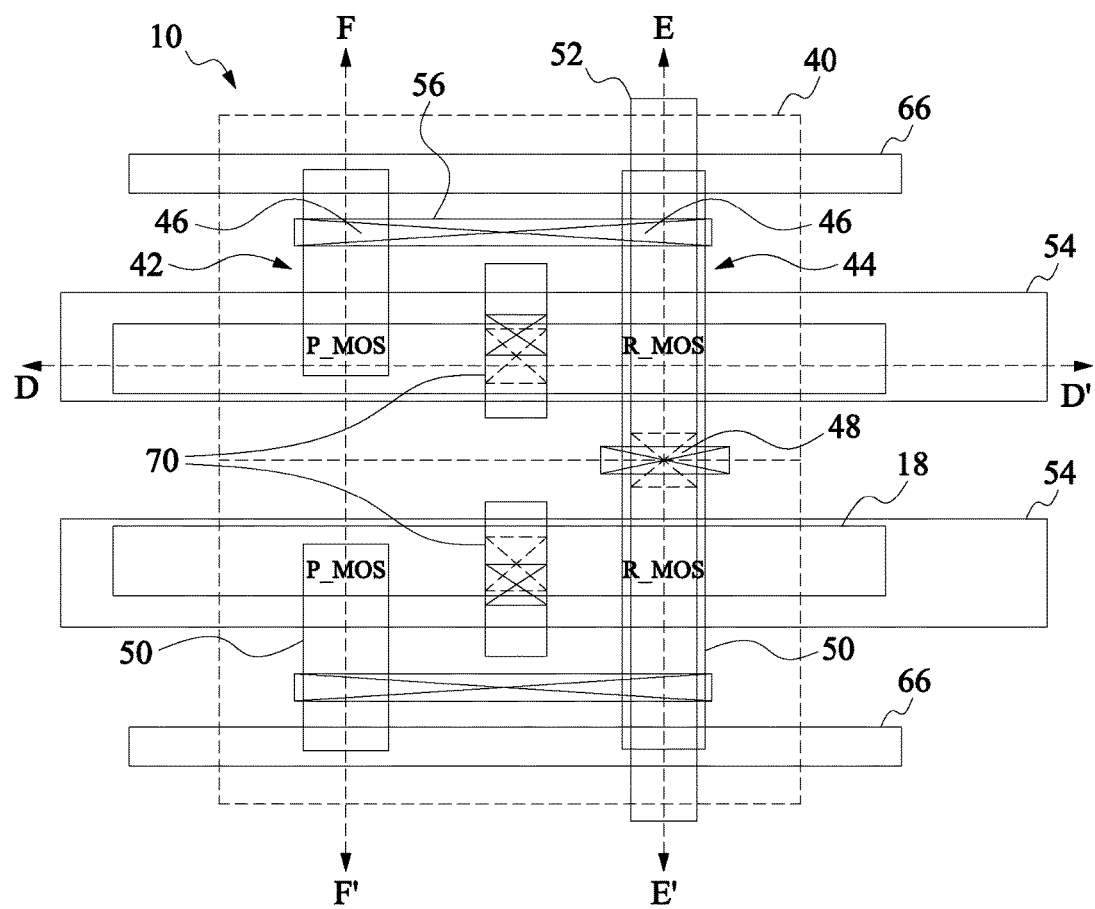
FIG. 10A-10D illustrate an embodiment of a semiconductor device having a one-time programming cell according to the present disclosure including overlying metal layer.
Figure 10B:
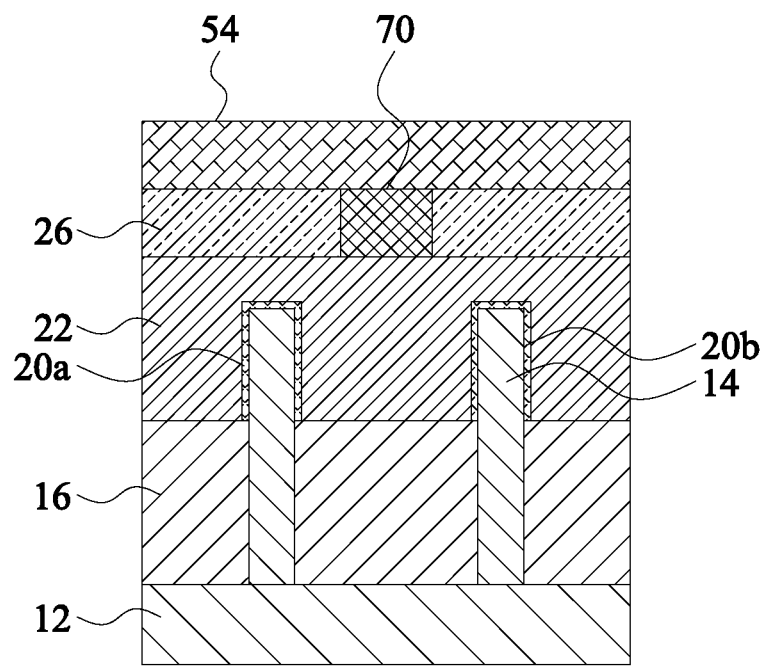
Figure 10C:
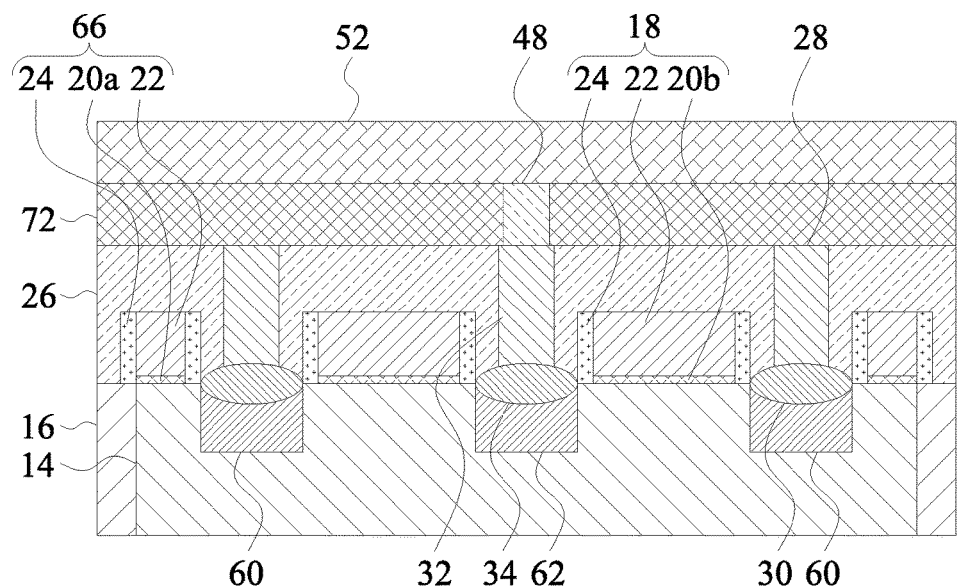

FIGS. 10A-10D depict an embodiment of the present disclosure including the overlying metal layers. FIG. 10A is a layout (plan view) of the embodiment and is the same as FIG. 4C, and FIGS. 10B, 10C, and 10D are cross-sectional views corresponding to lines D-D', E-E', and F-F' of FIG. 10A, respectively. A pair of one-time programming cells 10 have dummy gates 66 formed outside the transistors 42, 44. A word line 54 is disposed over the gate electrode structure 18 shared by the first MOS structure 42 and second MOS structure 44. In this this embodiment, the first MOS structure is a partial P_MOS transistor 42 and the second MOS structure 44 is a R_MOS transistor. The gate electrode to word line connection 70 connects the gate electrode structure 18 to the word line 54. A bit line 52 is disposed over the active region 50, and the bit line 52 is connected to the shared drain 62 of the adjacent R_MOS transistors 44 via drain node 48, as shown in FIG. 10C.

In certain embodiments of the disclosure, a routing direction of the gate electrode 18 and the word line 54 are parallel to each other along a first routing direction, and a routing direction of the bit line 52 is substantially perpendicular to the first routing direction.

A cross section view according to line D-D' is shown in FIG. 10B. The gate dielectric layer 20$a$, 20$b$ surrounds the portion of the fins 14 protruding from the insulating layer 16. As shown in the cross section view, the gate dielectric layer 20$b$ surrounding the fin 14 of the R_MOS transistor 44 is thicker than the gate dielectric layer 20$a$ surrounding the partial P_MOS transistor 42. The gate electrode 22 is electrically connected to the word line 54 via a gate electrode to word line connection 70 formed in the interlayer dielectric 26.

A cross section view according to line E-E' is shown in FIG. 10C. Dummy gates 66 are formed outside the R_MOS transistors 44. Source electrodes 28 are connected to the source regions 60 via source contacts 30, and a drain electrode 32 contacts the drain region 62 via a drain contact 34. As shown in the cross section view, the two adjacent R_MOS transistors 44 share the drain region 62, which is connected to bit line 52 via the drain node 48 formed in a third insulating layer 72 disposed over the interlayer dielectric 26.

Figure 10D:
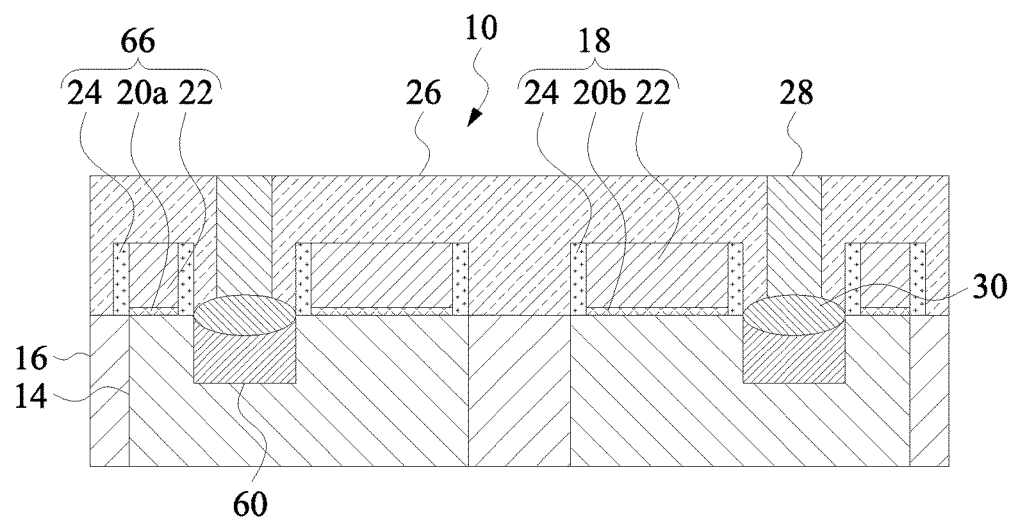

A cross section view according to line F-F' is shown in FIG. 10D. Dummy gates 66 are formed outside the partial P_MOS transistors 42. Source electrodes 28 are connected to the source regions 60 via source contacts 30. The active regions 50 of the partial P_MOS transistors 42 are separated by the insulating layer 16 in some embodiments.

Figure 11:
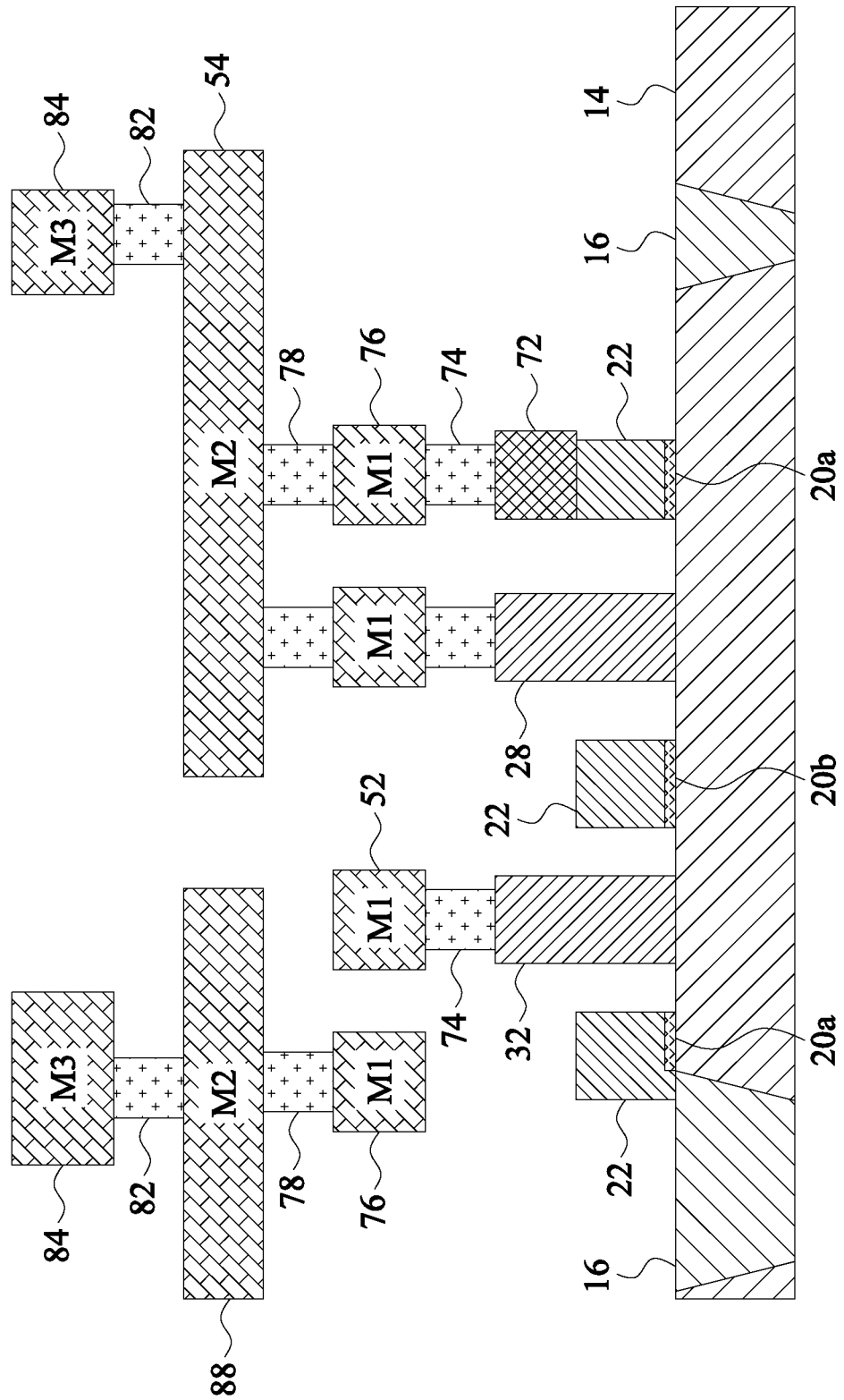
FIG. 11 illustrates a cross section of an embodiment of the present disclosure showing the arrangement of the metal layers.

A cross section of an embodiment of the disclosure showing the arrangement of the metal layers is shown in FIG. 11. Source and drain electrodes 28, 32 are connected to the first metal layer (M1) 76 by the first via layer 74. The bit line 52 is formed in M1 76 in some embodiments. The first metal layer is connected to the second metal layer (M2) 88 in some embodiments. The word line 54 is formed in M2 88 in some embodiments. Thus, the word line 54 is formed in a higher level from the semiconductor substrate than the bit line 52 in certain embodiments. Although, the semiconductor substrate is not shown in FIG. 11 in order to simplify the depiction of this embodiment, the semiconductor substrate is located directly below the fins 14. In some embodiments, the second metal layer 88 is further connected to a third metal layer (M3) 84, such as an interconnect, through a third via layer 82.

According to embodiments of the present disclosure, each one-time programming cell includes a programming transistor and a reading transistor having a common gate electrode and a correspondingly common word line thereby simplifying the cell layout and operation.

According to embodiments of the present disclosure, the thinner gate dielectric layer in the programming transistor reduces the voltage required to program the device, while the thicker gate dielectric layer in the reading transistor improves the device reliability.

According to embodiments of the present disclosure including partial transistors (e.g.—where the active region ends under the gate electrode) for the programming transistors controls the gate dielectric breakdown position (i.e.—close to the source node). This can improve the On-Off ratio, (the gate node to source node resistance ratio between the programming transistor and a non-programmed transistor, and further provides a tighter low resistance distribution.

According to an embodiment of the present disclosure, a one-time programing cell includes a first metal oxide semiconductor (MOS) structure and a second MOS structure having a common gate electrode electrically connected to a word line. The first MOS structure has a first gate dielectric layer and the second MOS structure has a second gate dielectric layer. The second gate dielectric layer is thicker than the first gate dielectric layer. Source nodes of the first MOS structure and the second MOS structure are electrically connected, and a drain node of the second MOS structure is electrically connected to a bit line.

According to another embodiment of the present disclosure, a one-time programing chip includes a plurality of one-time programming cells, each programming cell having a first metal oxide semiconductor (MOS) structure and a second MOS structure having a common gate electrode electrically connected to a word line. The first MOS structure has a first gate dielectric layer and the second MOS structure has a second gate dielectric layer, and the second gate dielectric layer is thicker than the first gate dielectric layer. The source nodes of the first MOS structure and the second MOS structure are electrically connected, and a drain node of the second MOS structure is electrically connected to a bit line.

According to another embodiment of the present disclosure, a method of programming a one-time programming chip is disclosed. The method includes providing a one-time programming chip having a plurality of one-time programming cells, each programming cell having: a first metal oxide semiconductor (MOS) structure and a second MOS structure having a common gate electrode electrically connected to a word line, wherein the first MOS structure has a first gate dielectric layer and the second MOS structure has a second gate dielectric layer, and the second gate dielectric layer is thicker than the first gate dielectric layer, wherein source nodes of the first MOS structure and the second MOS structure are electrically connected, and wherein a drain node of the second MOS structure is electrically connected to a bit line. Selecting one of the word lines and one of the bit lines, applying a first voltage to the selected word line during a program cycle, and applying a second voltage to the selected bit line during the program cycle. The first voltage is higher than the second voltage.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A one-time programing cell comprising:
a first metal oxide semiconductor (MOS) structure and a second MOS structure having a common gate electrode electrically connected to a word line, the first MOS structure including a first fin having a first portion embedded in an insulating layer and a second portion protruding from the insulating layer, and the second MOS structure including a second find having a first portion embedded in the insulating layer and a second portion protruding from the insulating layer,
wherein the first MOS structure has a first gate dielectric layer covering the second portion of the first fin and the second MOS structure has a second gate dielectric layer covering the second portion of the second fin, and the second gate dielectric layer is thicker than the first gate dielectric layer,
wherein source nodes of the first MOS structure and the second MOS structure are electrically connected,
wherein a drain node of the second MOS structure is electrically connected to a bit line, and
wherein the first gate dielectric layer and the second gate dielectric layer are separated from each other.

2. The one-time programming cell of claim 1, wherein the first MOS structure is a programming device and the second MOS structure is a reading device.

3. The one-time programming cell of claim 1, wherein the thickness of second gate dielectric layer is at least 30% thicker than the thickness of the first gate dielectric layer.

4. The one-time programming cell of claim 3, wherein the thickness of second gate dielectric layer is at least 50% thicker than the thickness of the first gate dielectric layer.

5. The one-time programming cell of claim 1, wherein a drain of the first MOS structure is a floating node.

6. The one-time programming cell of claim 1, wherein the common gate electrode comprises a metal and the first and second gate dielectric layers comprise a high-k material.

7. The one-time programming cell of claim 1, further comprising a dummy gate located outside the source nodes of the first MOS structure and the second MOS structure.

8. The one-time programming cell of claim 1, wherein the bit line is located on a first level metal layer, and the word line is located in a second level metal layer, wherein the second level is higher than the first level.

9. The one-time programming cell of claim 1, wherein the first MOS structure and the second MOS structure are N-type metal oxide semiconductor field effect transistors (MOSFET).

10. The one-time programming cell of claim 1, wherein a routing direction of the gate electrode and the word line are parallel to each other along a first routing direction, and a routing direction of the bit line is substantially perpendicular to the first routing direction.

11. A one-time programing chip comprising a plurality of one-time programming cells, each programming cell comprising:
a first metal oxide semiconductor (MOS) structure and a second MOS structure having a common gate electrode electrically connected to a word line,
wherein the first MOS structure has a first gate dielectric layer covering the second portion of the first fin and the second MOS structure has a second gate dielectric layer covering the second portion of the second fin, and the second gate dielectric layer is thicker than the first gate dielectric layer,
wherein source nodes of the first MOS structure and the second MOS structure are electrically connected, wherein a drain node of the second MOS structure is electrically connected to a bit line, and wherein the first gate dielectric layer and the second gate dielectric layer are separated from each other.

12. The one-time programming chip of claim 11, wherein the first MOS structure is a programming device and the second MOS structure is a reading device.

13. The one-time programming chip of claim 12, wherein the programming devices are selected from core devices and the reading devices are selected from input/output devices.

14. The one-time programming chip of claim 12, further comprising core devices and input/output devices, wherein the first gate dielectric layer is substantially same as gate dielectric layers in the core devices and the second gate dielectric layer is substantially same as gate dielectric layers in the input/output devices.

15. The one-time programming chip of claim 11, wherein the thickness of second gate dielectric layer is at least 30% thicker than the thickness of the first gate dielectric layer.

16. The one-time programming chip of claim 11, wherein the bit line is located on a first level metal layer, and the word line is located in a second level metal layer, wherein the second level is higher than the first level.

17. A method of programming a one-time programming chip comprising:

providing a one-time programming chip having a plurality of one-time programming cells, each programming cell comprising:

a first metal oxide semiconductor (MOS) structure and a second MOS structure having a common gate electrode electrically connected to a word line, the first MOS structure including a first fin having a first portion embedded in an insulating layer and a second portion protruding from the insulating layer, and the second MOS structure including a second fin having a first portion embedded in the insulating layer and a second portion protruding from the insulating layer, wherein the first MOS structure has a first gate dielectric layer covering the second portion of the first fin and the second MOS structure has a second gate dielectric layer covering the second portion of the second fin, and the second gate dielectric layer is thicker than the first gate dielectric layer, wherein source nodes of the first MOS structure and the second MOS structure are electrically connected, wherein a drain node of the second MOS structure is electrically connected to a bit line, and wherein the first gate dielectric layer and the second gate dielectric layer are separated from each other;

selecting one of the word lines and one of the bit lines; and applying a first voltage to the selected word line during a program cycle, and applying a second voltage to the selected bit line during the program cycle, thereby causing dielectric breakdown in the first MOS structure, wherein the first voltage is higher than the second voltage.

18. The method of programming a one-time programming chip according to claim 17, wherein the first voltage ranges from about 3 volts to about 5 volts, and the second voltage is about 0 volts.

19. The method of programming a one-time programming chip according to claim 17, further comprising applying a voltage of about 1.5 to about 2.5 volts to non-selected bit lines during the program cycle.

20. The method of programming a one-time programming chip according to claim 17, further comprising applying a voltage of about 0.8 volts to 1.8 volts to the selected word line during a read cycle.

* * * * *